United States Patent
Knisley et al.

(10) Patent No.: US 11,342,481 B2
(45) Date of Patent: May 24, 2022

(54) PRECLEAN AND ENCAPSULATION OF MICROLED FEATURES

(71) Applicant: Applied Materials, Inc., Santa Clara, CA (US)

(72) Inventors: Thomas Knisley, Livonia, MI (US); Bhaskar Jyoti Bhuyan, San Jose, CA (US); Mark Saly, Santa Clara, CA (US); Mingwei Zhu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 126 days.

(21) Appl. No.: 16/884,028

(22) Filed: May 26, 2020

(65) Prior Publication Data

US 2021/0376187 A1 Dec. 2, 2021

(51) Int. Cl.
*H01L 33/00* (2010.01)

(52) U.S. Cl.
CPC ...... *H01L 33/0095* (2013.01); *H01L 33/0093* (2020.05); *H01L 2933/005* (2013.01)

(58) Field of Classification Search
None
See application file for complete search history.

(56) References Cited

U.S. PATENT DOCUMENTS

| | | | |
|---|---|---|---|
| 2018/0047875 A1* | 2/2018 | Bedell | H01L 33/12 |
| 2019/0295843 A1* | 9/2019 | Yoo | H01L 21/67034 |
| 2019/0378957 A1 | 12/2019 | El-Ghoroury et al. | |
| 2021/0193886 A1* | 6/2021 | Yu | H01L 33/58 |
| 2021/0358999 A1* | 11/2021 | Kishimoto | H01L 33/62 |

FOREIGN PATENT DOCUMENTS

| | | |
|---|---|---|
| KR | 20180016064 A | 2/2018 |
| WO | 2015153592 A1 | 10/2015 |
| WO | 2018163019 A1 | 9/2018 |

OTHER PUBLICATIONS

PCT International Search Report and Written Opinion in PCT/US2021/034215, dated Sep. 15, 2021, 9 pages.

* cited by examiner

*Primary Examiner* — Bradley Smith
(74) *Attorney, Agent, or Firm* — Servilla Whitney LLC

(57) ABSTRACT

Method for cleaning and encapsulating microLED features are disclosed. Some embodiments provide for a wet clean process and a dry clean process to remove contaminants from the microLED feature. Some embodiments provide for the encapsulation of a clean microLED feature. Some embodiments provide improved crystallinity of the microLED feature and the capping layer. Some embodiments provide improved EQE of microLED devices formed from the disclosed microLED features.

19 Claims, 4 Drawing Sheets

PRECLEAN AND ENCAPSULATION OF MICROLED FEATURES

TECHNICAL FIELD

Embodiments of the disclosure generally relate to methods of cleaning and encapsulating substrate materials. In particular, embodiments of disclosure relate to methods of cleaning and encapsulating microLED features.

BACKGROUND

MicroLED displays have been identified as the next-generation display technology to replace traditional thin-film transistor liquid crystal displays (TFT-LCD) and organic LED (OLED) displays. MicroLEDs have the ability to use very low power while providing high performance (e.g., produce infinite contrast and high color gamut with low response times). Further, microLEDs can enable very high resolutions, are not susceptible to burn in, and have very simple process flows in manufacturing, thereby enabling a low cost of production while allowing device manufacturers to incorporate very thin displays in devices where thickness real estate is crucial (as no backlight or polarizer is needed). For reference, a microLED measures less than 100 µm which can be ¹/₁₀₀ the size of a conventional LED. As noted, microLEDs are self-emissive and don't require a backlight.

However, microLEDs suffer from poor conversion of electrical energy into light, also referred to as energy conversion efficiency. At current efficiency levels, microLED technology cannot deliver on a key promise of providing better efficiency than OLED. Therefore, there are significant advances needed in this area in order to make microLED display technology viable to the mass market.

Three main factors that determine the external quantum efficiency (EQE) of a microLED: extraction efficiency, injection efficiency, and radiative efficiency. Extraction efficiency entails how produced photons get partially reflected into the device, where they may be reabsorbed and converted into heat. Injection efficiency describes how well electron-hole pairs undergo recombination to produce photons. Injection efficiency is formally defined as the proportion of electrons passing through the device that are injected into the active region. Radiative efficiency involves the proportion of all electron-hole recombination events in the active region that are radiative and producing photons.

Improvements in extraction and injection efficiency can be made by improving the GaN crystal quality in the device as well as optimizing the epitaxial layer structure to maximize radiative recombination in the active region. However, impurities and defects in the device can enhance non-radiative recombination and lower the overall efficiency of microLED (specifically the radiative efficiency). Most of these defects can arise from etching processes or atmospheric oxidization.

Accordingly, there is a need for methods to remove surface impurities, oxidation, and defects. Further, there is also a need for a device protecting encapsulation layer. These methods have the potential to enhance microLED EQE.

SUMMARY

One or more embodiments of the disclosure are directed to a method of cleaning a microLED feature. The method comprises exposing a microLED feature having a layer of etch residue to a wet clean environment to remove at least a portion of the layer of etch residue. The microLED feature having a layer of etch residue is exposed to a dry clean environment to remove a portion of the layer of etch residue. The microLED feature is encapsulated with a capping layer.

Additional embodiments of the disclosure are directed to a method of cleaning a microLED feature. The method comprises etching a layered substrate to form a microLED feature. The microLED feature has a layer of etch residue thereon. The microLED feature is exposed to a wet clean environment to form a wet-clean microLED feature. The wet clean environment comprises HCl. The wet-clean microLED feature is exposed to a dry clean environment to form a clean microLED feature. The dry clean environment comprises trimethyl aluminum. The microLED feature is encapsulated with a capping layer. The capping layer comprises aluminum nitride and is formed by atomic layer deposition.

Further embodiments of the disclosure are directed to a method of cleaning a microLED feature. The method comprises etching a layered substrate to form a microLED feature. The microLED feature has a layer of etch residue thereon which comprises carbon and/or oxide contaminants. The microLED feature is exposed to a wet clean environment to remove carbon contaminants and form a wet-clean microLED feature. The wet clean environment comprises HCl. The wet-clean microLED feature is exposed to a dry clean environment to remove oxide contaminants and form a clean microLED feature. The dry clean environment comprises trimethyl aluminum. The microLED feature is encapsulated with a capping layer comprising aluminum nitride and formed by atomic layer deposition. The capping layer and surface of the clean microLED feature are both crystalline with similar orientation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers.

Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiment of the disclosure is directed to a method of cleaning a microLED feature. Some embodiments of the disclosure advantageously improve the EQE of a microLED device fabricated from the microLED feature cleaned according to one or more embodiment of the disclosure.

For the avoidance of doubt, within this disclosure, a microLED feature is not a complete microLED device. Stated differently, the methods disclosed herein provide a cleaned and encapsulated microLED feature which may be further processed into an operable microLED device.

Figure 1:
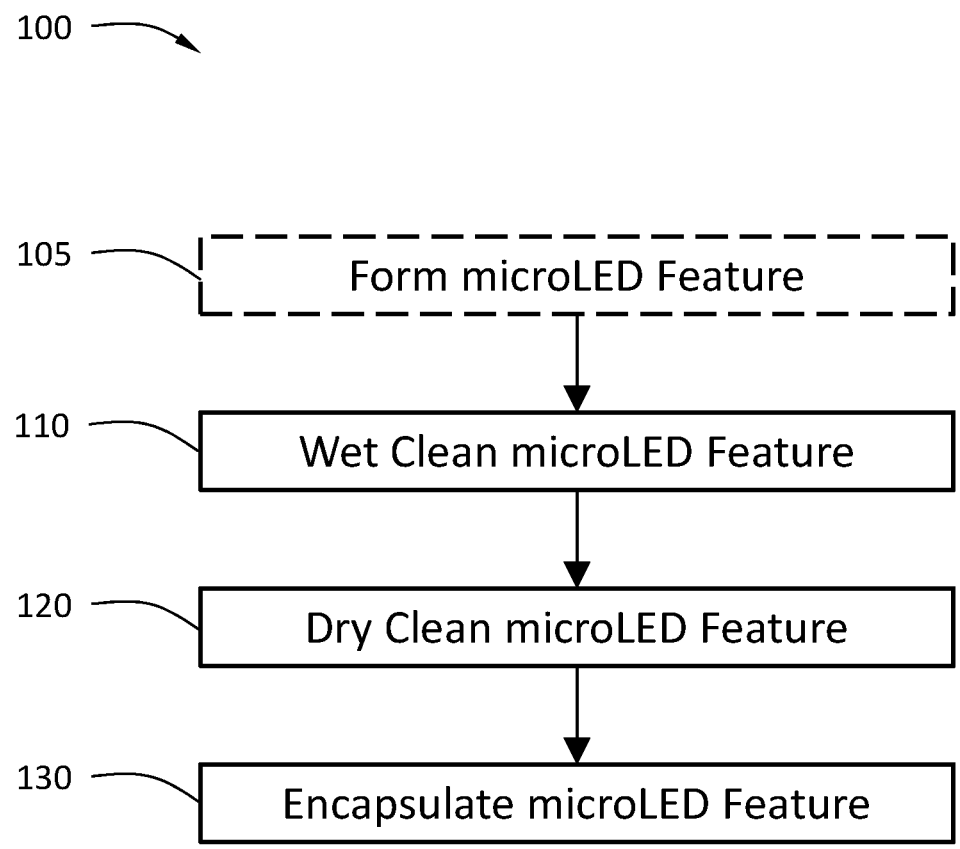
FIG. 1 is a flowchart of an exemplary processing method according to one or more embodiment of the disclosure.
Figure 2:
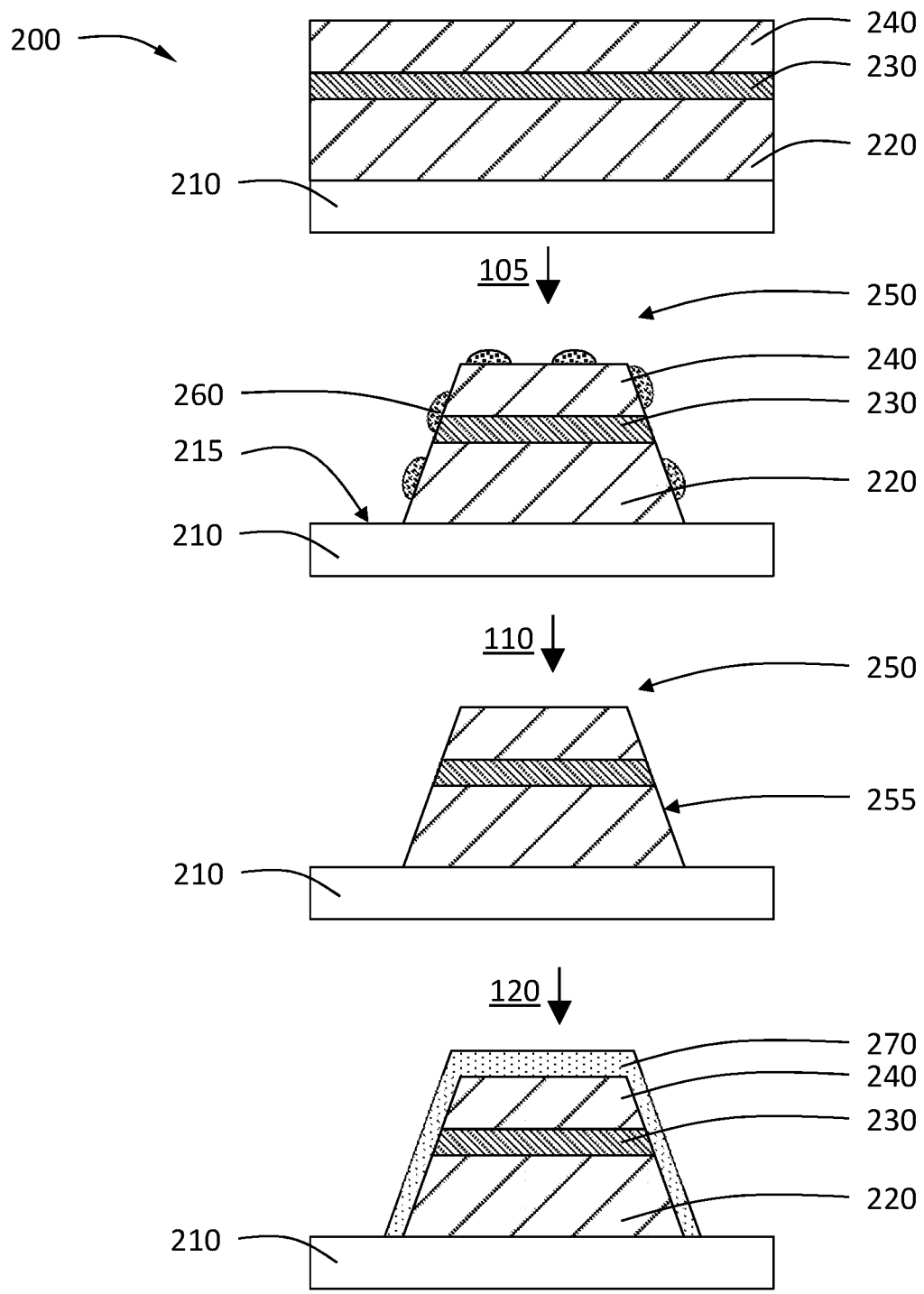
FIG. 2 is a cross-sectional view of an exemplary substrate undergoing processing according to one or more embodiment of the disclosure.

Referring to FIGS. 1 and 2, an exemplary method 100 begins with optional operation 105 where a microLED feature 250 is formed by etching a layered substrate 200. The layered substrate comprises a substrate material 210 with a substrate surface 215. In some embodiments, the substrate material 210 comprises sapphire.

In the embodiments shown, the layered substrate 200 further comprises a first layer 220, a second layer 230, and a third layer 240 on the substrate surface 215. In some embodiments, the first layer 220 and the third layer 240 are comprised of the same material.

In some embodiments, the first layer 220 and the third layer 240 comprise or consist essentially of GaN. As used in this regard, a material which "consists essentially of" a stated material comprises greater than or equal to about 95%, greater than or equal to about 98%, greater than or equal to about 99%, or greater than or equal to about 99.5% of the stated material on an atomic basis. Further, the disclosure of a material composition (e.g. GaN) should not be understood to imply any specific stoichiometry.

In some embodiments, the second layer comprises a quantum well. The quantum well of some embodiments comprises a plurality of InGaN/GaN pairs. In some embodiments, the number of pairs is in a range of about 2 to about 10 pairs, in a range of about 4 to about 10 pairs or in a range of about 5 to about 8 pairs.

Without being bound by theory, it is believed that the indium concentration of the quantum well affects the output wavelength from the microLED device. In some embodiments, the indium concentration of the quantum well is in a range of about 2 atomic percent to about 35 atomic percent or in a range of about 5 atomic percent to about 30 atomic percent. In some embodiments, the indium concentration of the quantum well is less than or equal to about 5 atomic percent, about 15 atomic percent, about 20 atomic percent, or greater than or equal to about 30 atomic percent.

Figure 3:
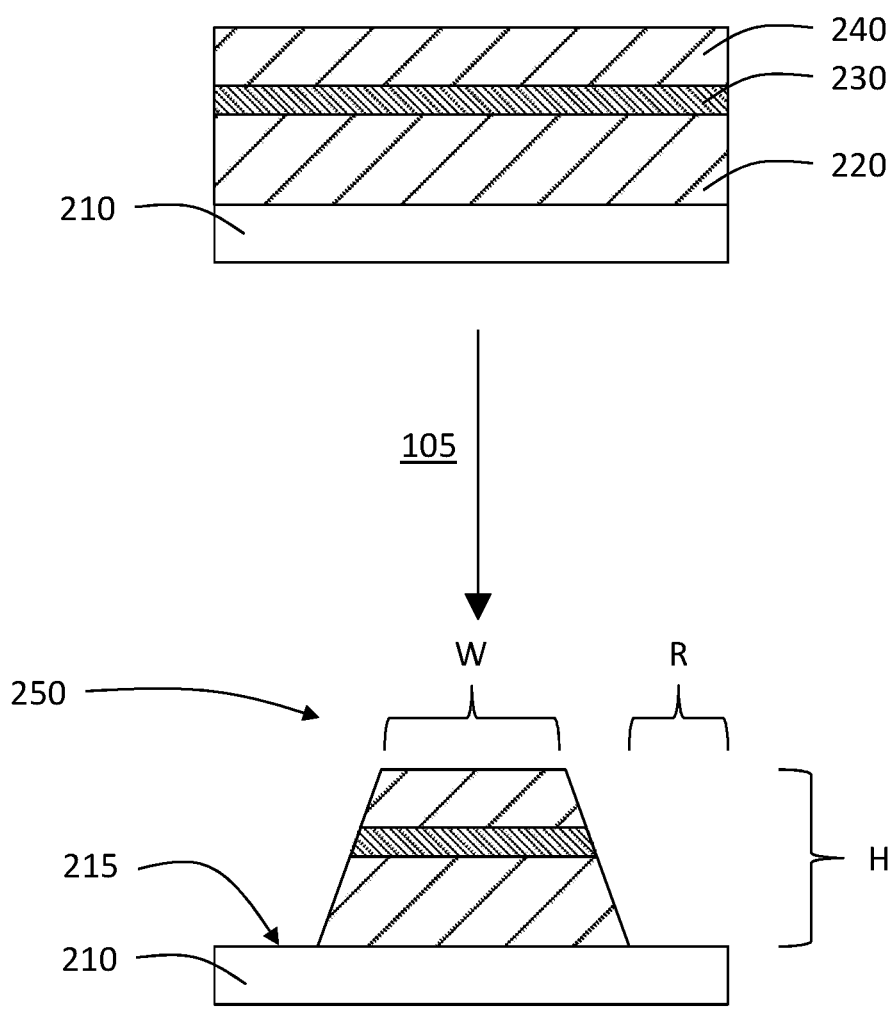
FIG. 3 is a cross-sectional view of a microLED feature according to one or more embodiment of the disclosure.

With reference to FIG. 3, the etching operation 105 removes the first layer 220, the second layer 230 and the third layer 240 from predetermined regions R of the layered substrate 200 to expose the substrate surface 215 in the predetermined regions R. The remaining stack of the first layer 220, the second layer 230, and the third layer 240 is referred to as a microLED feature 250.

The microLED feature 250 has an average width W and a height H. The ratio of the height H divided by the average width W is the aspect ratio of the microLED feature 250. In some embodiments, the aspect ratio of the microLED feature 250 is in a range of about 1:1 to about 20:1, in a range of about 2:1 to about 10:1, or in a range of about 5:1 to about 10:1. In some embodiments, the aspect ratio of the microLED feature 250 is about 8:1.

While a single microLED feature is shown, a single substrate 200 may contain multiple microLED features 250. In some embodiments, the spacing between adjacent microLED features 250 is greater than or equal to about 200 nm, greater than or equal to about 500 nm, or greater than or equal to about 1 µm.

In some embodiments, as shown, the microLED feature 250 has a mesa shape with slanted sidewalls. However, the disclosure is not limited in this regard and embodiments in which the sidewalls of the microLED feature 250 are arranged differently are also within the scope of this disclosure.

The etching performed at operation 105 may be performed by any suitable means to remove the first layer 220, the second layer 230 and the third layer 240. In some embodiments, the layered substrate 200 is etched by a reactive ion etch (RIE). In some embodiments, the layered substrate 200 is dry etched by exposure to a $Cl_2/BCl_3$ gas mixture. In some embodiments, the layered substrate 200 is wet etched by exposure to a KOH solution. In some embodiments, the layered substrate 200 is etched by the dry etch $Cl_2/BCl_3$ gas mixture and then the KOH solution. Without being bound by theory, it is believed that the etch process including both a $Cl_2/BCl_3$ gas mixture and a KOH solution reduces surface roughness and removes defects from the exposed surface 255.

Referring again to FIG. 2, the etching performed at operation 105 leaves a layer of etch residue 260 on the exposed surface 255 of the microLED feature 250. In embodiments, when operation 105 is not performed, the microLED feature 250 begins method 100 having a layer of etch residue 260. In some embodiments, the layer of etch residue 260 is present on each of the surface of the first layer 220, the second layer 230 and the third layer 240.

As shown in FIG. 2, the layer of etch residue 260 may not be continuous. In some embodiments, as shown, the layer of etch residue 260 may not have a uniform thickness. In some embodiments, the average thickness of the layer of etch residue is in a range of about 1 Å to about 50 Å, in a range of about 5 Å to about 50 Å, in a range of about 10 Å to about 40 Å, or in a range of about 20 Å to about 30 Å.

In some embodiments, the layer of etch residue 260 may not have a uniform composition. In some embodiments, the layer of etch residue comprises carbon contaminants, oxide contaminants and/or halogen contaminants. In some embodiments, when one or more of the first layer, the second layer, or the third layer comprises GaN, the oxide contaminants comprise GaO. In some embodiments, the halogen contaminants may comprise chlorine atoms or ions.

Referring again to FIG. 1, in some embodiments, when operation 105 is not performed, the method begins at 110 by exposing a microLED feature 250 to a wet clean environment. In some embodiments, operation 110 is performed after operation 105. The exposure of the microLED feature 250 to the wet clean environment may also be referred to as wet cleaning the microLED feature 250.

In some embodiments, wet cleaning the microLED feature 250 may be performed by submerging the substrate 200 in a wet clean solution. In some embodiments, the wet clean solution wet cleaning the microLED feature 250 may be performed by exposing the substrate 200 to a vapor of the cleaning solution within a processing chamber.

The wet clean environment may be any suitable environment which removes a portion of the layer of etch residue 260. In some embodiments, the wet clean environment removes at least some carbon contaminants from the microLED feature. In some embodiments, the wet clean environment removes at least some oxide contaminants from the microLED feature 250.

The wet clean environment comprises one or more of a strong acid, an amine or an alcohol. In some embodiments, the strong acid is selected from hydrochloric acid (HCl) and nitric acid ($HNO_3$). In some embodiments, the amine is selected from ammonia, dimethylamine, triethylamine, hydrazine, and hydrazine derivatives. In some embodiments, the alcohol is selected from methanol, ethanol, and isopropanol.

In some embodiments, the wet clean environment comprises a solution of one or more of a strong acid, an amine or an alcohol with a solvent. In some embodiments, the solvent is selected from water, an alcohol, an organic solvent, or combinations thereof.

In some embodiments, the exposure parameters of the wet clean operation 110 may be controlled. In some embodiments, the period of exposure may be controlled. For example, the period of exposure may be in a range of about 1 second to about 3600 seconds (1 hour), in a range of about 1 second to about 900 seconds, in a range of about 1 second to about 300 seconds, in a range of about 1 second to about 120 seconds, in a range of about 1 second to about 60 seconds, in a range of about 30 seconds to about 3600 seconds, in a range of about 60 seconds to about 3600 seconds, in a range of about 120 seconds to about 3600 seconds, in a range of about 300 seconds to about 3600 seconds, in a range of about 900 seconds to about 3600 seconds, in a range of about 1800 seconds to about 3600 seconds or in a range of about 300 seconds to about 900 seconds. In some embodiments, the period of exposure is about 10 minutes.

In some embodiments, the temperature of the substrate 200 or the wet clean environment may be controlled. For example, the temperature of the substrate may be maintained at a temperature in a range of about 20° C. to about 100° C. or processed at the ambient temperature without specific control of the temperature of the substrate 200.

In some embodiments, the concentration of the wet clean environment may be controlled. For example, the concentration of the wet clean environment may be in a range of about 1 ppm to 100% concentration. In some embodiments, the concentration is in a range of about 1 ppm to about 0.1%, 1%, 5% or 10%. In some embodiments, the concentration of the wet clean environment is about 100%.

In some embodiments, the wet clean environment comprises isopropanol and the substrate is soaked for 10 minutes at ambient temperature.

In some embodiments, after exposure to the wet clean environment, the substrate 200 may be rinsed to remove any residual component of the wet clean environment. In some embodiments, the substrate 200 is rinsed with one or more of water, an alcohol, or an organic solvent.

In some embodiments, after exposure to the wet clean environment, the substrate 200 may be dried to remove any residual volatile component of the wet clean environment. In some embodiments, the substrate 200 is dried with an inert gas. In some embodiments, the inert gas comprises one or more of hydrogen gas ($H_2$), nitrogen gas ($N_2$), or argon (Ar).

In some embodiments, the substrate 200 may be heated to dry the substrate 200. In some embodiments, the substrate 200 may be maintained under vacuum to dry the substrate.

The method continues at 120 by exposing the microLED feature 250 to a dry clean environment. In some embodiments, as shown, operation 110 is performed before operation 120. However, the scope of the disclosure is not limited in this regard. In some embodiments, operation 120 may be performed before operation 110. In some embodiments, operation 120 is performed after operation 105. The exposure of the microLED feature 250 to the dry clean environment may also be referred to as dry cleaning the microLED feature 250.

Without limiting the scope of the disclosure, in one or more embodiments, operation 120 is performed within a processing chamber. In these embodiments, the microLED feature 250 is exposed dry clean environment by flowing a vapor of the dry clean environment into the processing chamber by flowing a vapor of the dry clean environment into the processing chamber.

The dry clean environment may be any suitable environment which removes a portion of the layer of etch residue 260. In some embodiments, the dry clean environment removes at least some carbon contaminants from the microLED feature 250. In some embodiments, the dry clean environment removes at least some oxide contaminants from the microLED feature 250.

The dry clean environment comprises one or more of an alkyl metal compound, a silane, hydrogen gas, nitrogen trifluoride ($NF_3$), a thiol, a substituted cyclohexadiene, or a substituted dihydropyrazine. In some embodiments, the alkyl metal compound comprises one or more of trimethyl aluminum (TMA), trimethyl indium, trimethyl gallium, triethyl aluminum, or diethyl zinc.

In some embodiments, the alkyl metal compound consists essentially of trimethyl aluminum. As used in this regard, an environment which "consists essentially of" a stated material comprises greater than or equal to about 95%, greater than or equal to about 98%, greater than or equal to about 99%, or greater than or equal to about 99.5% of the stated material on an molar basis, excluding any inert or non-reactive species.

In some embodiments, the exposure parameters of the dry clean operation 120 may be controlled. In some embodiments, the period of exposure may be controlled. For example, in some embodiments, the period of exposure is in a range of about 0.1 second to about 10 minutes. The dry clean operation may also pulse components of the dry clean environment into the processing chamber. In some embodiments, the pulse durations are in a range of about 0.1 second to about 30 seconds, in a range of about 0.1 seconds to about 10 seconds, in a range of about 0.1 seconds to about 5 seconds or in a range of about 0.1 s to about 1 second.

In some embodiments, the pressure of the processing chamber may be controlled. For example, in some embodiments, the pressure may be in a range of about 1 mTorr to about 760 Torr.

In some embodiments, the temperature of the processing chamber or the substrate 200 may be controlled. For example, in some embodiments, the temperature may be maintained in a range of about 25° C. to about 500° C., in a range of about 100° C. to about 400° C., or in a range of about 200° C. to about 300° C.

In some embodiments, the flow rate of the dry clean environment into the processing chamber may be controlled. For example, the dry clean environment may be flowed into the processing chamber at a flow rate in a range of about 1 sccm to about 1 slm.

In a specific embodiment, TMA is flowed into a processing chamber maintained at 250° C. for 0.2 seconds at 0.6 Torr, followed by a $N_2$ purge for 20 seconds. The processing chamber is then pumped down. The above process is repeated. In some embodiments, the above process may be repeated 5 times.

Without being bound by theory, it is believed that by separating the dry clean environment into separate pulses or bursts, the processing chamber is better able to pump put any volatile reaction byproducts. In so doing, exposure to the dry clean environment, surface reactivity and/or cleaning effect is maximized.

After operations 110 and 120, at 130 the microLED feature 250 is encapsulated with a capping layer 270. In some embodiments, the microLED feature 250 is not exposed to air immediately before encapsulating the microLED feature 250. Stated differently, after exposing the microLED feature 250 to the wet clean environment and the dry clean environment, the microLED feature is not exposed to air before encapsulating the microLED feature 250.

Without being bound by theory, it is believed that preventing exposure to air before encapsulating the microLED feature 250 prevents the formation of oxide contaminants on the surface of the microLED feature 250. It is believed that the prevention of oxide contaminants is one factor in the crystallinity of the capping layer 270 as further described below.

In some embodiments, an exposed surface 255 of the microLED feature 250 is substantially free of contaminants before encapsulating the microLED feature 250. As used in this regard, a surface which is "substantially free of contaminants" has a concentration of each of carbon, oxygen and halogen atoms within the top 10 Å of the material of less than or equal to about 1 atomic percent, less than or equal to about 0.5 atomic percent or less than or equal to about 0.1 atomic percent. Alternatively, a surface which is "substantially free of contaminants" may be qualitatively determined based on the crystalline quality of a later deposited encapsulating layer.

In some embodiments, the exposed surface 255 of the microLED feature 250 is crystalline before encapsulating the microLED feature 250. As used in this regard, a surface which is crystalline has less than or equal to about 5 percent, less than or equal to about 2 percent, less than or equal to about 1 percent, or less than or equal to about 0.5 percent amorphous on a unit area basis.

In some embodiments, the capping layer is substantially conformal to the exposed surface 255 of the microLED feature 250. As used in this regard, a capping layer which is substantially conformal has a thickness at every point which is within ±20%, within ±10%, within ±5%, or within ±2% of the average thickness of the capping layer.

In some embodiments, the capping layer 270 is selectively deposited on the exposed surface 255 of the microLED feature 250 over the substrate surface 215. As used herein, terms like "selectively deposit", mean that a first amount or thickness is deposited on a first surface and a second amount or thickness is deposited on a second surface. The second amount or thickness is less than the first amount or thickness, or, in some embodiments, no amount is deposited on the second surface. As used in this regard, the term "over" does not imply a physical orientation of one surface on top of another surface, rather a relationship of the thermodynamic or kinetic properties of the chemical reaction with one surface relative to the other surface. In some embodiments, not shown, the capping layer 270 is formed on the substrate surface 215. In some embodiments, where the capping layer 270 is formed on the substrate surface 215, the capping layer 270 is later etched or otherwise removed from the substrate surface 215.

In some embodiments, the capping layer 270 is formed by exposing the microLED feature 250 to a metal precursor and a reactant. In some embodiments, the capping layer 270 is formed by chemical vapor deposition (CVD). In some embodiments, the capping layer 270 is formed by atomic layer deposition.

In some embodiments, the capping layer comprises or consists essentially of aluminum nitride. In some embodiments, the capping layer 270 is formed by sequentially exposing the microLED feature 250 to trimethyl aluminum and a plasma formed from ammonia.

In some embodiments, during the formation of the capping layer 270, the substrate material 210 and/or the microLED feature 250 is maintained at a temperature in a range of about 150° C. to about 300° C., in a range of about 200° C. to about 300° C., or in a range of about 225° C. to about 275° C. In some embodiments, during the formation of the capping layer 270, the substrate material 210 and/or the microLED feature 250 is maintained at a temperature of about 250° C.

In some embodiments, when the capping layer 270 comprises aluminum nitride, the capping layer is substantially crystalline with a <100> orientation. In some embodiments, the capping layer 270 has the same orientation as the layers 220, 230, 240 of the microLED feature 250.

In some embodiments, the capping layer 270 is hermetic. In some embodiments, the capping layer 270 inhibits and/or prevents oxidation of the microLED feature. As used in this regard, a "hermetic" layer prevents oxidation of any underlayers by exposure to air or water.

The capping layer 270 may be exposed to oxidative test conditions to test the hermeticity of the capping layer 270. Oxidative test conditions may include plasma enhanced atomic layer deposition of silicon oxide (60 Å using BDEAS and 50 W $O_2$/Ar plasma) on the capping layer surface, exposure to a low powered (e.g. 50 W) $O_2$/Ar plasma, or exposure to steam at an elevated temperature (e.g. 400° C.) for an extended period of time (e.g. 2 hours). Regardless of the test method, the depth of oxygen atoms within the capping layer 270 or the microLED feature 250 provides an indication of the hermeticity of the capping layer 270, (i.e. shallower depths of oxidation indicate better or higher hermeticity).

Figure 4:
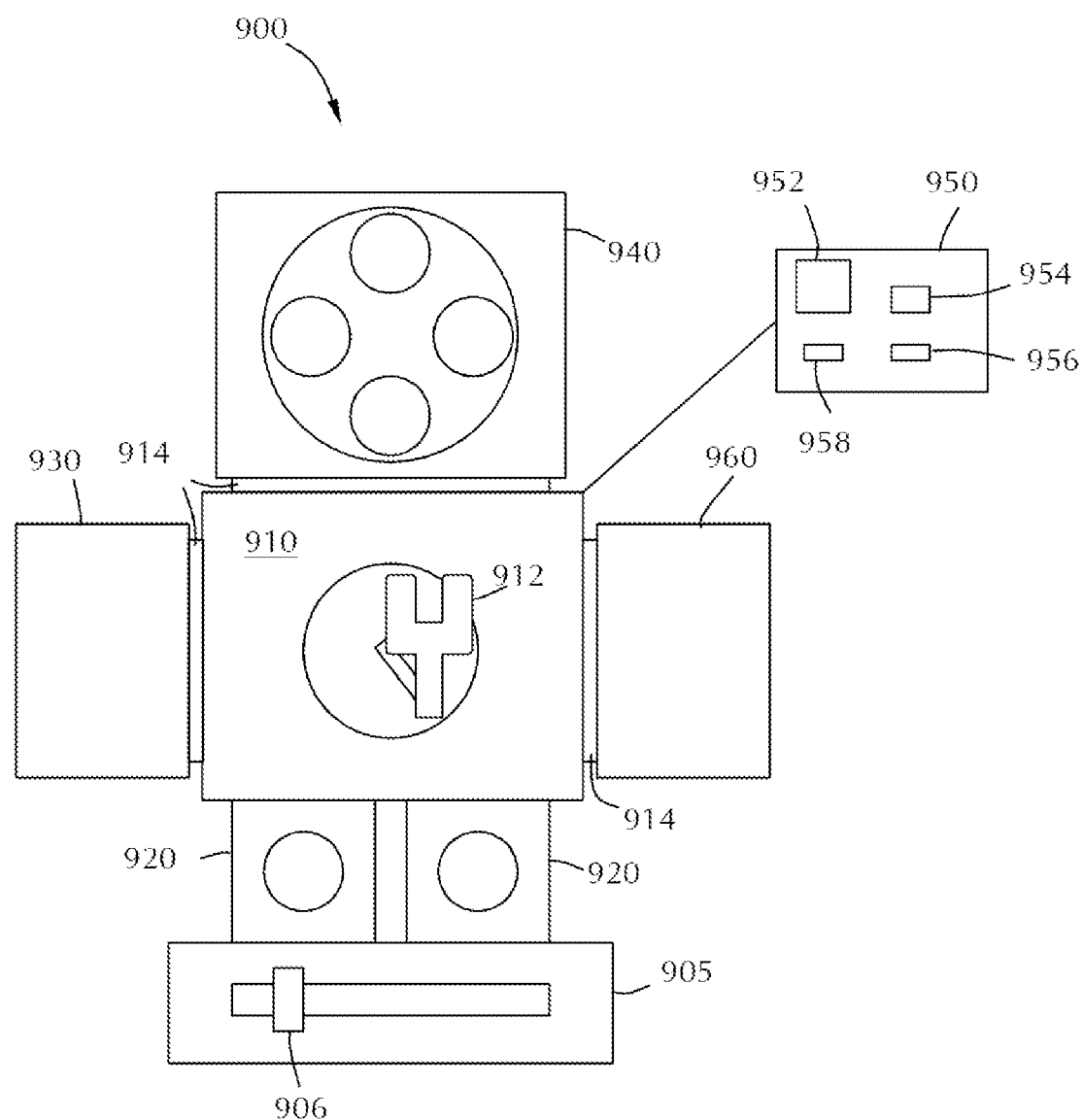
FIG. 4 is a schematic view of a cluster tool according to one or more embodiment of the disclosure.

With reference to FIG. 4, additional embodiments of the disclosure are directed to a processing system 900 for executing the methods described herein. FIG. 4 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a wet cleaning chamber and may be in fluid communication with one or more gas or liquid sources to provide one or more flows to the first processing chamber 930 to perform the wet clean process. The substrate can be moved to and from the processing chamber 930 by the robot 912 passing through isolation valve 914.

Processing chamber 940 can also be connected to the central transfer station 910. In some embodiments, processing chamber 940 comprises a dry cleaning chamber and is fluid communication with one or more reactive gas sources to provide flows to the processing chamber 940 to perform the dry clean process. The substrate can be moved to and from the processing chamber 940 by robot 912 passing through isolation valve 914.

In some embodiments, processing chamber 960 is connected to the central transfer station 910 and is configured to act as a capping layer deposition chamber. The processing chamber 960 can be configured to perform one or more different deposition processes.

In some embodiments, the dry clean process occurs in the same processing chamber as the capping layer deposition process. In embodiments of this sort, the processing chamber 940 and processing chamber 960 can be configured to perform the clean and encapsulation processes on two substrates at the same time.

In some embodiments, each of the processing chambers 930, 940, and 960 are configured to perform different portions of the processing method. For example, processing chamber 930 may be configured to perform the wet clean process, processing chamber 940 may be configured to perform the dry clean process, and processing chamber 960 may be configured to perform a capping layer deposition process. The skilled artisan will recognize that the number and arrangement of individual processing chambers on the tool can be varied and that the embodiment illustrated in FIG. 4 is merely representative of one possible configuration.

In some embodiments, the processing system 900 includes one or more metrology stations. For example metrology stations can be located within pre-clean/buffer chamber 920, within the central transfer station 910 or within any of the individual processing chambers 930, 940, 960. The metrology station can be any position within the system 900 that allows for measurement of the substrate without exposing the substrate to an oxidizing environment.

At least one controller 950 is coupled to one or more of the central transfer station 910, the pre-clean/buffer chamber 920, and processing chambers 930, 940, or 960. In some embodiments, there is more than one controller 950 connected to the individual chambers or stations and a primary control processor is coupled to each of the separate controllers to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to etch a layered substrate; a configuration to wet clean a microLED feature; a configuration to dry clean a microLED feature; and/or a configuration to encapsulate a microLED feature.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of cleaning a microLED feature, the method comprising:
    exposing a microLED feature having a layer of etch residue to a wet clean environment to remove at least a portion of the layer of etch residue;
    exposing the microLED feature having a layer of etch residue to a dry clean environment to remove a portion of the layer of etch residue, the dry clean environment comprising one or more of a silane, hydrogen gas, nitrogen trifluoride, a thiol, a substituted cyclohexadiene, or a substituted dihydropyrazine; and
    encapsulating the microLED feature with a capping layer.

2. The method of claim 1, further comprising etching a layered substrate to form the microLED feature having the layer of etch residue.

3. The method of claim 2, wherein the layered substrate is etched by a reactive ion etching (RIE) process.

4. The method of claim 1, wherein the layer of etch residue has an average thickness in a range of about 20 Å to about 30 Å.

5. The method of claim 1, wherein the layer of etch residue comprises carbon contaminants and oxide contaminants.

6. The method of claim 1, wherein the wet clean environment comprises one or more of a strong acid, an amine or an alcohol.

7. The method of claim 1, further comprising rinsing and drying the microLED feature after exposure to the wet clean environment.

8. The method of claim 1, wherein the microLED feature is exposed to the wet clean environment before exposure to the dry clean environment.

9. The method of claim 1, wherein the dry clean environment comprises an alkyl metal compound.

10. The method of claim 9, wherein the alkyl metal compound comprises one or more of trimethyl aluminum, trimethyl indium, trimethyl gallium, triethyl aluminum or diethyl zinc.

11. The method of claim 1, wherein the microLED feature is not exposed to air immediately before encapsulating the microLED feature.

12. The method of claim 1, where in an exposed surface of the microLED feature is substantially free of contaminants and crystalline before encapsulating the microLED feature.

13. The method of claim 1, wherein the capping layer consists essentially of aluminum nitride.

14. The method of claim 13, wherein the capping layer is crystalline with a <100> orientation.

15. The method of claim 1, wherein the capping layer is formed by atomic layer deposition.

16. The method of claim 15, wherein the capping layer is formed by sequentially exposing the microLED feature to trimethyl aluminum and a plasma formed from ammonia.

17. The method of claim 1, wherein the capping layer is hermetic and prevents oxidation of the microLED feature.

18. A method of cleaning a microLED feature, the method comprising:
    etching a layered substrate to form a microLED feature, the microLED feature having a layer of etch residue thereon;
    exposing the microLED feature to a wet clean environment to form a wet-clean microLED feature, the wet clean environment comprising HCl;
    exposing the wet-clean microLED feature to a dry clean environment to form a clean microLED feature, the dry clean environment comprising trimethyl aluminum; and
    encapsulating the microLED feature with a capping layer, the capping layer comprising aluminum nitride and formed by atomic layer deposition.

19. A method of cleaning a microLED feature, the method comprising:
    etching a layered substrate to form a microLED feature, the microLED feature having a layer of etch residue thereon, the layer of etch residue comprising carbon and/or oxide contaminants;
    exposing the microLED feature to a wet clean environment to remove carbon contaminants and form a wet-clean microLED feature, the wet clean environment comprising HCl;
    exposing the wet-clean microLED feature to a dry clean environment to remove oxide contaminants and form a clean microLED feature, the dry clean environment comprising trimethyl aluminum; and
    encapsulating the microLED feature with a capping layer, the capping layer comprising aluminum nitride and formed by atomic layer deposition,
    wherein the capping layer and surface of the clean microLED feature are both crystalline with similar orientation.

* * * * *